(12) United States Patent
Barlocchi et al.

(10) Patent No.: US 7,230,315 B2
(45) Date of Patent: Jun. 12, 2007

(54) INTEGRATED CHEMICAL MICROREACTOR WITH LARGE AREA CHANNELS AND MANUFACTURING PROCESS THEREOF

(75) Inventors: Gabriele Barlocchi, Cornaredo (IT); Ubaldo Mastromatteo, Bareggio (IT); Flavio Francesco Villa, Milan (IT)

(73) Assignee: STMicroelectronics S.r.L., Agrate Brianza (IT)

( * ) Notice: Subject to any disclaimer, the term of this patent is extended or adjusted under 35 U.S.C. 154(b) by 201 days.

(21) Appl. No.: 10/996,593

(22) Filed: Nov. 24, 2004

(65) Prior Publication Data
US 2005/0181392 A1 Aug. 18, 2005

Related U.S. Application Data

(63) Continuation-in-part of application No. 10/712,211, filed on Nov. 12, 2003, now Pat. No. 6,992,367.

(30) Foreign Application Priority Data
Nov. 28, 2003 (EP) .................................. 03425770

(51) Int. Cl.
*H01L 29/00* (2006.01)
*H01L 31/06* (2006.01)
*H01L 31/00* (2006.01)
*H01L 29/06* (2006.01)
*H01L 29/40* (2006.01)

(52) U.S. Cl. ...................... 257/522; 257/466; 257/618; 257/622; 257/E23.013; 257/E23.098

(58) Field of Classification Search ................ 257/522, 257/466, 618, 622, E23.013, E23.098
See application file for complete search history.

(56) References Cited

U.S. PATENT DOCUMENTS

| 4,389,429 | A | * | 6/1983 | Soclof ......................... 438/492 |
| 4,682,503 | A | * | 7/1987 | Higashi et al. ................ 73/755 |
| 4,993,143 | A |   | 2/1991 | Sidner et al. |
| 5,429,734 | A |   | 7/1995 | Gajar et al. |
| 5,637,469 | A |   | 6/1997 | Wilding et al. |
| 5,639,423 | A |   | 6/1997 | Northrup et al. |
| 5,922,591 | A |   | 7/1999 | Anderson et al. |
| 5,939,312 | A |   | 8/1999 | Baier et al. |

(Continued)

FOREIGN PATENT DOCUMENTS

IT   TO2002A000808   11/2003

OTHER PUBLICATIONS

Zou, Q.B., Single-Chip Fabrication of Integrated Fluid Systems (IFS), Micro Electro Mechanical Systems, 1998. MEMS 98 Proceedings, 11th Annual International Workshop, Jan. 1998; IEEE Catalog # 98CH36176, pp. 448-453.

(Continued)

*Primary Examiner*—Jerome Jackson
*Assistant Examiner*—Jesse A. Fenty
(74) *Attorney, Agent, or Firm*—Baker & McKenzie LLP

(57) ABSTRACT

The microreactor has a body of semiconductor material; a large area buried channel extending in the body and having walls; a coating layer of insulating material coating the walls of the channel; a diaphragm extending on top of the body and upwardly closing the channel. The diaphragm is formed by a semiconductor layer completely encircling mask portions of insulating material.

7 Claims, 5 Drawing Sheets

U.S. PATENT DOCUMENTS

| | | |
|---|---|---|
| 5,942,443 A | 8/1999 | Parce et al. |
| 6,046,056 A | 4/2000 | Parce et al. |
| 6,168,948 B1 | 1/2001 | Anderson et al. |
| 6,211,056 B1* | 4/2001 | Begley et al. ............... 438/619 |
| 6,234,016 B1* | 5/2001 | Bonne et al. ............ 73/204.26 |
| 6,261,431 B1 | 7/2001 | Mathies et al. |
| 6,267,858 B1 | 7/2001 | Parce et al. |
| 6,376,291 B1 | 4/2002 | Barlocchi et al. |
| 6,403,367 B1 | 6/2002 | Cheng et al. |
| 6,693,039 B2* | 2/2004 | Erratico et al. ............. 438/700 |
| 6,710,311 B2* | 3/2004 | Villa et al. .................. 219/521 |
| 6,770,471 B2 | 8/2004 | Barlocchi et al. |
| 6,974,693 B2* | 12/2005 | Barlocchi et al. ........ 435/288.5 |
| 2001/0036672 A1 | 11/2001 | Anderson et al. |
| 2002/0017660 A1 | 2/2002 | Villa et al. |
| 2002/0022261 A1 | 2/2002 | Anderson et al. |
| 2002/0045244 A1 | 4/2002 | Barlocchi et al. |
| 2002/0055167 A1 | 5/2002 | Pourahmadi et al. |
| 2002/0060156 A1 | 5/2002 | Mathies et al. |
| 2002/0068334 A1 | 6/2002 | Carrino et al. |
| 2002/0068357 A1 | 6/2002 | Mathies et al. |
| 2002/0097900 A1 | 7/2002 | Arena et al. |
| 2003/0057199 A1 | 3/2003 | Villa et al. |
| 2004/0132059 A1 | 7/2004 | Scurati et al. |
| 2004/0206749 A1* | 10/2004 | Villa et al. .................. 219/521 |
| 2005/0282221 A1* | 12/2005 | Barlocchi et al. ............... 435/6 |

OTHER PUBLICATIONS

Search report, EP 03 425 770 filed Jul. 7, 2004.

Zhang, N., Automated and Integrated System for Thigh-Throughput DNA Genotyping Directly from Blood, Analytical Chemistry, Mar. 15, 1999, pp. 1138-1145, vol. 71(6).

* cited by examiner

INTEGRATED CHEMICAL MICROREACTOR WITH LARGE AREA CHANNELS AND MANUFACTURING PROCESS THEREOF

PRIOR RELATED APPLICATIONS

This application is a continuation-in-part of publication US20040106290 (issued as U.S. Pat. No. 6,992,367), filed Nov. 12, 2003, which claims priority to publication US2001049200, filed Feb. 27, 2001 (issued as U.S. Pat. No. 6,693,039), which claims priority to publication EP1130631, filed Feb. 29, 2000. It also claims priority to application EP03425770.9, filed Nov. 28, 2003.

FIELD OF THE INVENTION

The present invention refers to an integrated chemical microreactor with large area channels and to the manufacturing process thereof.

BACKGROUND OF THE INVENTION

Typical procedures for analyzing biological materials, such as nucleic acid, involve a variety of operations starting from raw material. These operations may include various degrees of cell purification, lysis, amplification or purification, and analysis of the resulting amplified or purified product.

As an example, in DNA-based blood tests the samples are often purified by filtration, centrifugation or by electrophoresis so as to eliminate all the non-nucleated cells.

Then, the remaining white blood cells are lysed using chemical, thermal or biochemical means in order to liberate the DNA to be analyzed.

Next, the DNA is denatured by thermal, biochemical or chemical processes and amplified by an amplification reaction, such as PCR (polymerase chain reaction), LCR (ligase chain reaction), SDA (strand displacement amplification), TMA (transcription-mediated amplification), RCA (rolling circle amplification), and the like. The amplification step allows the operator to avoid purification of the DNA being studied because the amplified product greatly exceeds the starting DNA in the sample.

The procedures are similar if RNA is to be analyzed, but more emphasis is placed on purification or other means to protect the labile RNA molecule. RNA is usually copied into DNA (cDNA) and then the analysis proceeds as described for DNA.

Finally, the amplification product undergoes some type of analysis, usually based on sequence or size or some combination thereof. In an analysis by hybridization, for example, the amplified DNA is passed over a plurality of detectors made up of individual oligonucleotide probe fragments that are anchored, for example, on electrodes. If the amplified DNA strands are complementary to the probes, stable bonds will be formed between them and the hybridized probes can be read by observation by a wide variety of means, including optical, electrical, mechanical, magnetic or thermal means.

Other biological molecules are analyzed in a similar way, but typically molecule purification is substituted for amplification and detection methods vary according to the molecule being detected. For example, a common diagnostic involves the detection of a specific protein by binding to its antibody or by a specific enzymatic reaction. Lipids, carbohydrates, drugs and small molecules from biological fluids are processed in similar ways.

The discussion herein is simplified by focusing on nucleic acid analysis, in particular DNA amplification, as an example of a biological molecule that can be analyzed using the devices of the invention. However, as described above, the invention can be used for any chemical or biological test.

The steps of nucleic acid analysis described above are currently performed using different devices, each of which presides over one part of the process. The use of separate devices decreases efficiency and increases cost, in part because of the required sample transfer between the devices. Another contributor to inefficiencies are the large sample sizes, required to accommodate sample loss between devices and instrument limitations. Most importantly, expensive, qualified operators are required to perform the analysis. For these reasons a fully integrated micro-device would be preferred.

For performing treatment of fluids, integrated microreactors of semiconductor material are already known.

For example, publication EP1161985 (corresponding to U.S. Pat. No. 6,710,311 et seq.) describes a microreactor and the respective manufacturing process suitable for DNA-amplification processes.

According to this process, a substrate of monocrystalline silicon is etched in TMAH to form a plurality of thin channels that are then coated with a material inhibiting epitaxial growth; then a monocrystalline epitaxial layer is grown on top of the substrate and of the channels. The epitaxial layer closes at the top the buried channels and forms, together with the substrate, a semiconductor body. The surface of the semiconductor body is then covered with an insulating layer; heating and sensing elements are formed on the insulating layer; inlet and outlet apertures are formed through the insulating layer and the semiconductor body and connect the surface of the structure so obtained with the buried channels. Then, a covering structure accommodating an inlet and an outlet reservoir is formed or bonded on the structure accommodating the buried channels.

According to a different solution, disclosed e.g. in publication EP1193214 (corresponding to U.S. Pat. No. 6,770,471) for manufacturing buried cavities, the channels are etched using a grid-like mask having a particular orientation. The grid-like mask is made of polysilicon completely surrounded by nitride; after channel etching, the nitride is removed and a pseudo-epitaxial layer is grown from the mask polysilicon. In the alternative, in case of reduced width channels, the grid-like mask is made of insulating material, and the pseudo-epitaxial layer is directly grown thereon, after forming the channels.

According to a further different embodiment, for manufacturing buried cavities, the channels are etched using a grid-like mask of silicon oxide and nitride and are closed upwardly by depositing a polysilicon layer that collects around the grid-like mask and by oxidizing the polysilicon layer. This embodiment, similar to the one described e.g. in Italian patent application TO2002A000808 filed on Sep. 17, 2002 and publication EP1400600 filed on Sep. 17, 2003 (corresponding to publication US2004132059 filed Sep. 16, 2003) in the name of the same applicant regarding a fully integrated microreactor system, containing pretreatment channels, lysis chambers, amplification channels, heaters, detectors, and a micropump, is described hereinbelow with reference to FIGS. 1–5.

Initially, FIG. 1, a wafer 10 including a substrate 1 of semiconductor material, e.g. silicon, is masked to form channels. To this end, a pad oxide layer 3 (with a thickness of, e.g., 550 nm) and a nitride layer 4 (with a thickness of, e.g., 540 nm) are deposited on a surface 5 of the substrate 1 and then photolithographically defined to form a hard mask 2. The hard mask 2 has groups of openings 6, e.g. with a square, rectangular or lozenge shape.

Then, FIG. 2, using the hard mask 2, the substrate 1 is etched using tetramethylammoniumhydroxide (TMAH), forming channels 13.

Next, FIG. 3, a polysilicon layer 14 (with a thickness of, e.g., 450 nm) is deposited and coats the surface of the hard mask 2 and the walls 13a of the channels 13. In addition, the polysilicon layer 14 completely surrounds the hard mask 2, covering also the lateral sides and the lower side.

The polysilicon layer 14 is then thermally oxidized (FIG. 4); during oxidation, the polysilicon increases its volume so as to close the openings 6 and to form a silicon oxide layer 15 of about 2 μm. Moreover, an oxide layer 16 is formed also on the walls 13a of the channels 13.

Thereafter, a seed layer 17 of polysilicon is deposited (FIG. 5) and removed, together with the oxide layer 15, the nitride layer 4 and the pad oxide layer 3, outside the region of the channels 13; and a pseudo-epitaxial layer 18 is grown (e.g. for a thickness of 10 μm). The pseudo-epitaxial layer 18 is polycrystalline above the seed layer and monocrystalline on the substrate 1. The surface of the pseudo-epitaxial layer 18 is then thermally oxidized, forming an upper oxide layer 19, obtaining the structure of FIG. 5.

Then the process continues with the other steps for forming heating elements, inlets/outlets, sensing elements and an upper layer having input/output reservoirs on top of the inlets/outlets.

The above solution has proven satisfactorily, but is suitable only when the microreactor is to be used for treating small amounts of liquids. In fact, the height of the channels is strictly dependent on the width thereof, due to the TMAH etching technique, and the width of the channel cannot be increased beyond a preset value (about 200 μm) because, due to its manufacturing technique, the oxide diaphragm is subject to stresses and may break easily. Thus, the volume of each channel is limited and when high volumes of liquids are to be treated, it is necessary to increase the number of channels. However such solution is disadvantageous, since it involves a corresponding increase in the dimensions of the microreactor and can lead to uneven treatment conditions across the microreactor.

SUMMARY OF THE INVENTION

The aim of the present invention is therefore to provide a microreactor and a manufacturing process overcoming the drawbacks of the known solutions.

According to the present invention, there are provided a chemical microreactor and its manufacturing process, as defined, respectively, in claim 1 and claim 8, and in the embodiments described below. Generally speaking, the invention allows the manufacture of larger buried channels than were previously possible.

BRIEF DESCRIPTION OF THE DRAWINGS

For a better understanding of the present invention, two preferred embodiments thereof are now described, simply as non-limiting examples, with reference to the attached drawings, wherein.

DESCRIPTION OF EMBODIMENTS OF THE INVENTION

Figure 1:
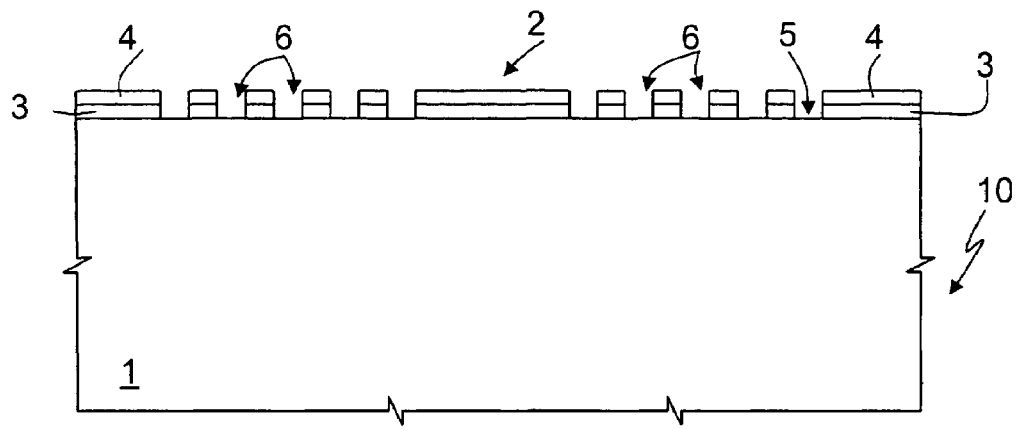
FIGS. 1–5 show cross-sections through a wafer of semiconductor material in successive manufacturing steps of a microreactor according to a known solution.
Figure 2:
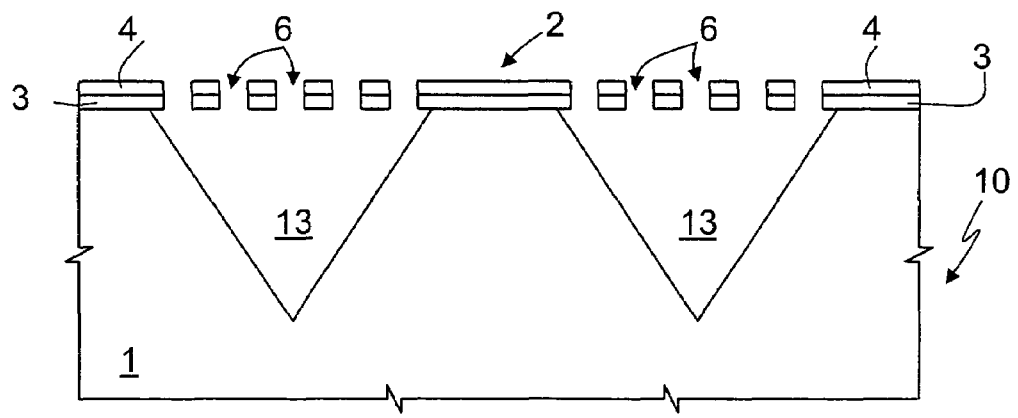
Figure 3:
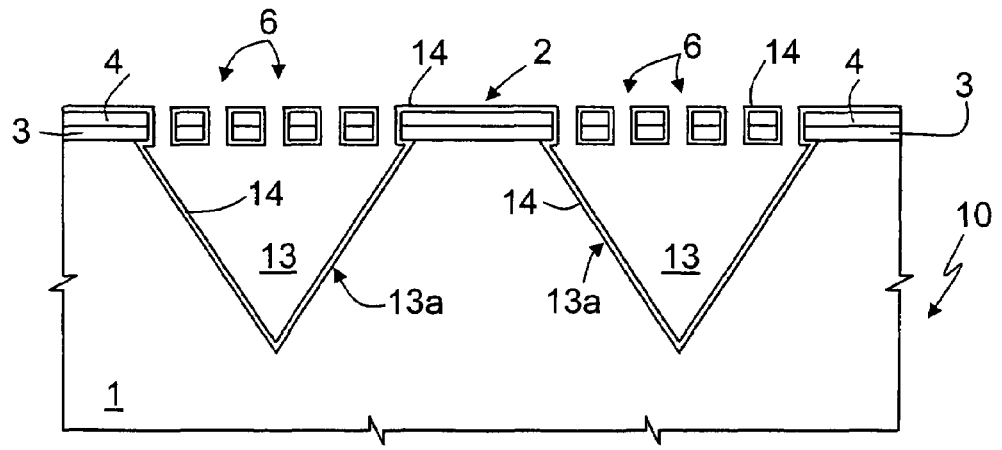
Figure 4:
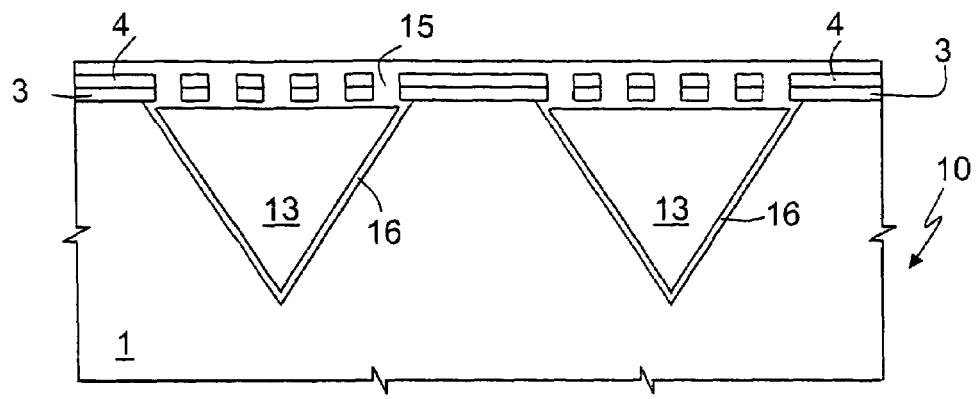
Figure 5:
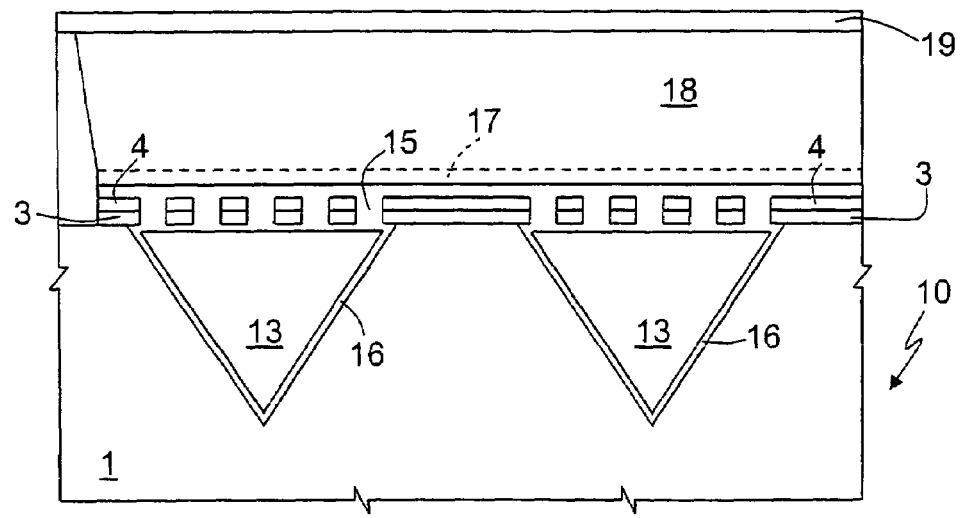
Figure 6:
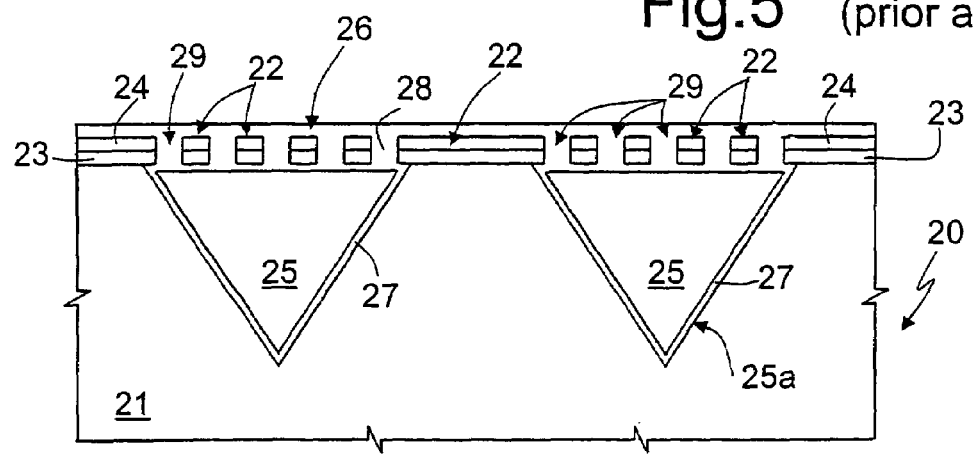
FIGS. 6–9 are cross-sections through a wafer of semiconductor material in successive manufacturing steps of a microreactor according to a first embodiment.

A first embodiment of the invention will be described with reference to FIGS. 6 to 9. The various layers and regions are not in scale, for better representation.

According to a first embodiment, the process has first process steps analogous to the known process. Accordingly, FIG. 6, a wafer 20 including a substrate 21 of semiconductor material, e.g. silicon, is covered by a hard mask 22. In detail, first a pad oxide layer 23 (with a thickness of, e.g., 550 mm) and then a nitride layer 24 (with a thickness of, e.g., 140 nm) are deposited on the substrate. Then layers 23, 24 are photolithographically defined to form the hard mask 22. The hard mask 22 has groups of openings 29, e.g. with a square shape having all the same side length (e.g., 11=2 μm), and arranged at a mutual distance d of e.g., 1.4 μm. Then, the substrate 21 is etched through the openings 29 of the hard mask 22, using tetramethylammoniumhydroxide (TMAH), forming channels 25.

Thereafter, a polysilicon layer is deposited. The thickness of the polysilicon layer is selected so as to completely fill the openings 29 of the hard mask 22; for example, the thickness of the deposited polysilicon layer is 2 μm. At the end, diaphragms 26 are formed, that comprise a polysilicon layer 28 completely surrounding the hard mask 22; the diaphragms 26 close upwardly the channels 25, that are here completely buried; furthermore, a polysilicon layer 27 covers walls 25a of the channels 25.

Figure 7:
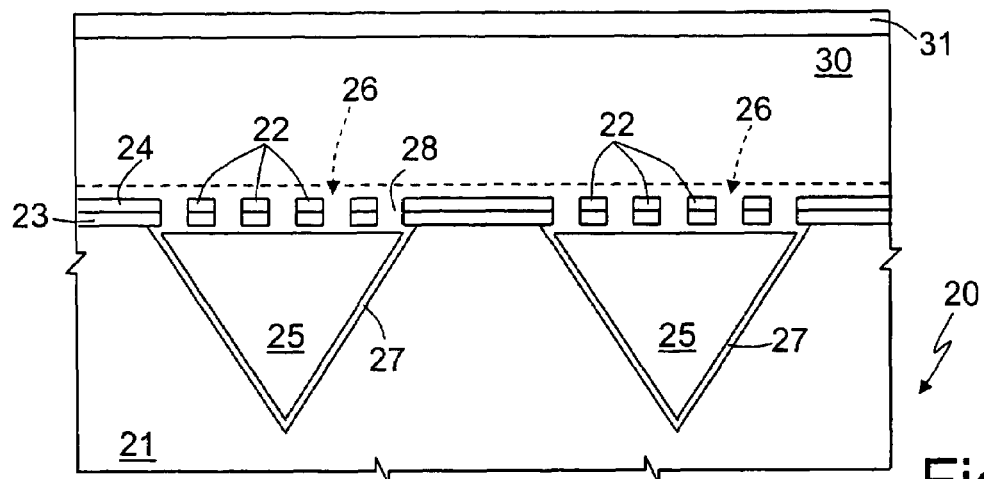

Then, FIG. 7, using the polysilicon layer 28 as a seed, a pseudo-epitaxial layer 30 is grown, e.g. for a thickness of 10 μm and the surface of the pseudo-epitaxial layer 30 is oxidized to form an upper oxide layer 31.

Figure 8:
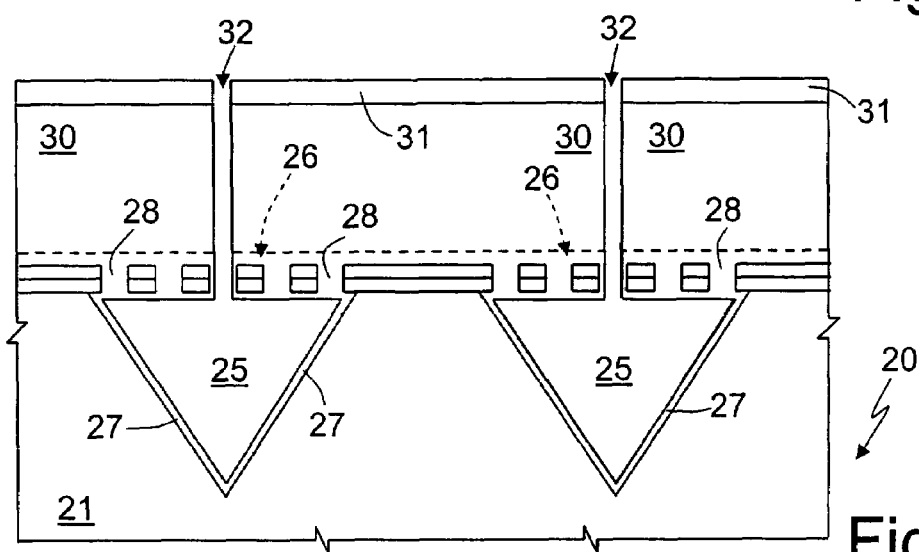
Figure 9:
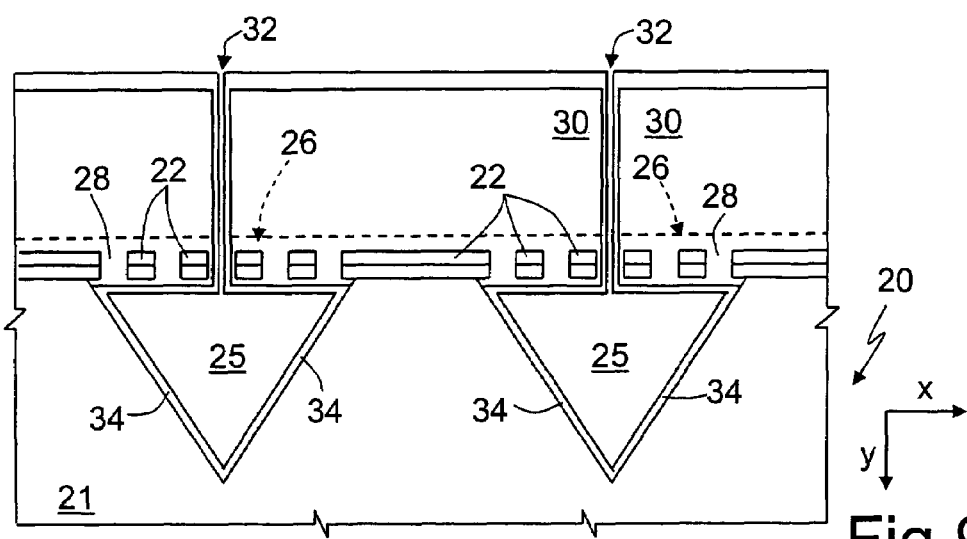

Then, FIG. 8, for each channel 25, one or more holes 32 are formed through the upper oxide layer 31 and the diaphragms 26, until the channels 25 are reached. Then, FIG. 9, using the holes 32, the polysilicon layer 27 covering the walls 25a of each channel 25 is thermally oxidized, forming an oxide coating 34 about 500 nm thick. The presence of an oxide coating 34 on the inner walls of the channels 25 is important for amplification reactions to occur, but any material that makes the walls less reactive to biological materials will do.

Subsequently, FIG. 10, a first insulating layer 35 of TEOS is deposited on the surface of the wafer 20, to close upwardly the holes 32; then heaters 36 of polycrystalline silicon are formed on the first insulating layer 35; a second insulating layer 39 of oxide is deposited on the heaters 36; contact regions 37 (and related metal lines) in contact with the heaters 36 are formed; a third insulating layer 40 is deposited, for example of TEOS; then detection electrodes 38 of titanium, nickel and gold are formed, in a known manner.

Then, a protective layer 41 of resist is formed and defined on the third insulating layer 40. Inlet apertures 44a and outlet apertures 44b are formed, and extend from the surface of the protective layer 41 as far as the substrate 21, substantially aligned with the longitudinal ends of the respective channels 25. A front resist layer 50 is deposited and defined to form an input reservoir 51a and an output reservoir 51b. In particular, the input reservoir 51a communicates with the input aperture 44a, whereas the output reservoir 51b communicates with the output aperture 44b, and surrounds the detection electrode 38.

Figure 10:
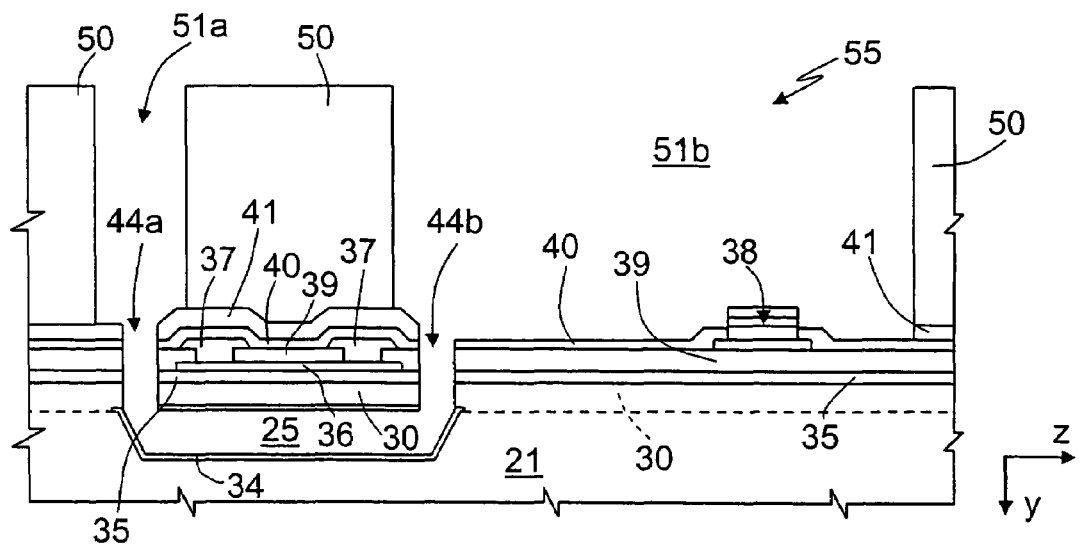
FIG. 10 is a cross-section taken along a plane perpendicular to those of FIGS. 6–9, to show the structure of a finished microreactor.

Finally, the exposed portions of the protective layer 41 are removed, so as to expose the detection electrode 38, and the wafer 20 is cut into dice, to give a plurality of microreactors 55, as shown in FIG. 10.

According to a different embodiment, the substrate 21 is covered by a hard mask having at least one bigger opening for each channel, so that the polysilicon deposited to form the diaphragms does not completely close upwardly the channels.

Figure 11:
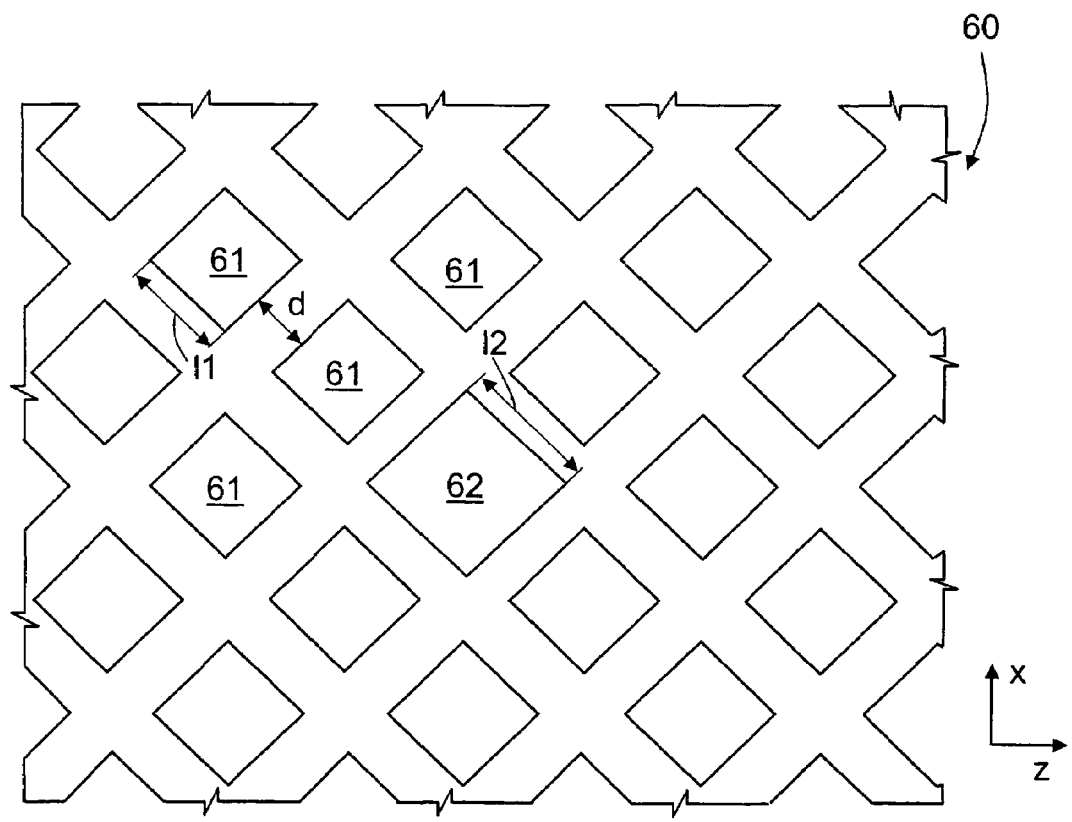
FIG. 11 shows a top view of a mask used for a second embodiment of the process according to the invention.
Figure 12:
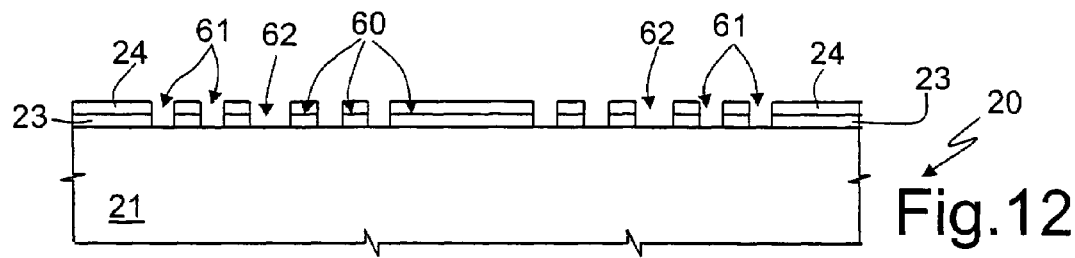
FIGS. 12–15 show cross-sections through a wafer of semiconductor material in successive manufacturing steps of a microreactor according to the second embodiment.

In detail, FIG. 12, on the substrate 21 of a wafer 20, a hard mask 60 is formed. The hard mask 60 is formed also here by pad oxide and nitride portions 23, 24 and has the shape shown in FIG. 11. As visible, the hard mask 60 has a plurality of square openings 61 with a same side length (e.g., 11=2 µm), arranged at a uniform, mutual distance d of e.g., 1.4 µm, and at least one wider opening 62 having a side length 12 of, e.g., 2.8 µm.

Figure 13:
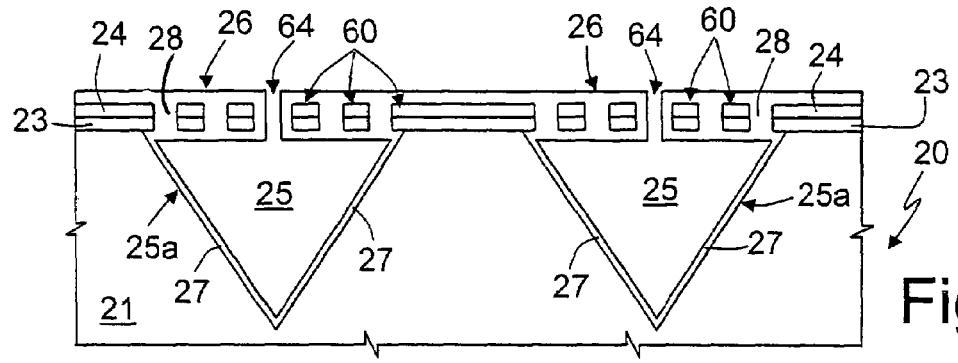

Then, FIG. 13, analogously to the first embodiment, the channels 25 are etched using TMAH, and a polysilicon layer with a thickness of 2 µm is deposited. Also here, a polysilicon layer 28 incorporates pad oxide and nitride portions 23, 24 to form diaphragms 26; however, polysilicon is not able to completely fill the wider opening 62, so that each diaphragm 26 has at least one aperture 64 that upwardly connects the respective channel 25 with the outer environment. Furthermore, polysilicon layers 27 are formed on the walls 25a of the channels 25.

Figure 14:
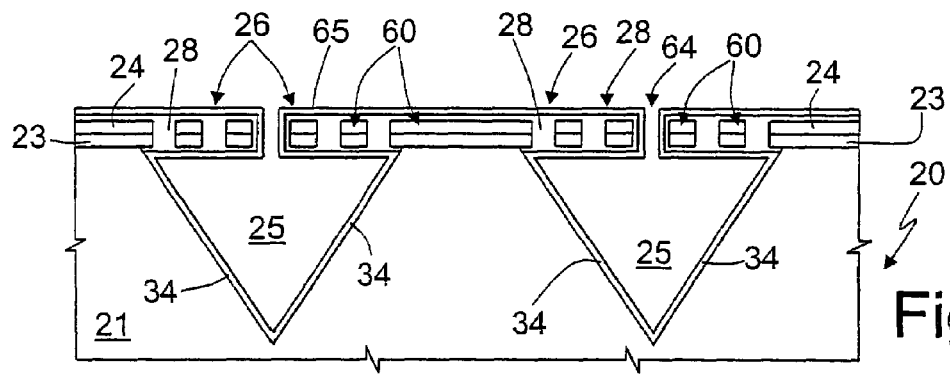

Thereafter, FIG. 14, the polysilicon layer 27 covering the walls 25a of the channels 25 is thermally oxidized through the aperture 64 until a depth of 500 nm, forming the oxide coatings 34. The surface of the diaphragms 26 is also oxidized and form an oxide layer 65.

Figure 15:
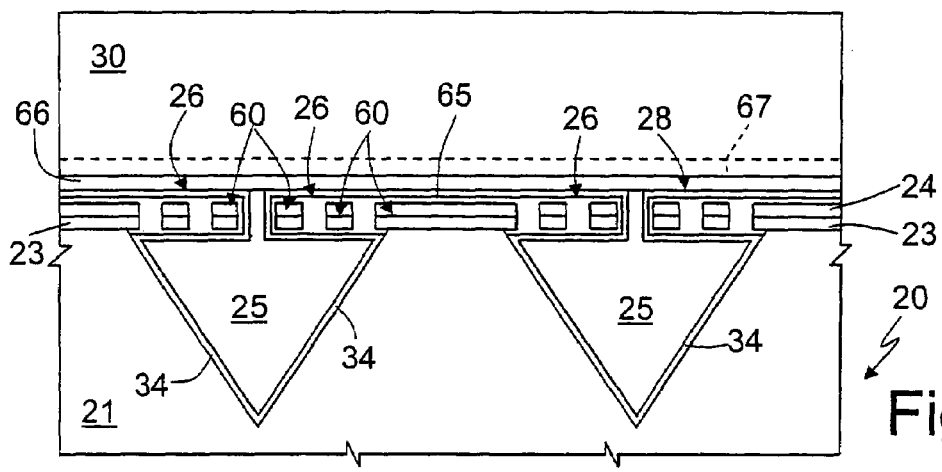

Subsequently, FIG. 15, the apertures 64 are closed by a closing layer 66 of insulating material, e.g. TEOS oxide; a seed layer 67 of polysilicon is deposited; the pseudo-epitaxial layer 30 is grown, e.g. for a thickness of 10 µm.

The process goes on with the steps already described above to obtain the final structure shown in FIG. 10.

By virtue of the described process, the channels 25 are upwardly closed by diaphragms of silicon that completely enclose nitride and oxide portions, and are not subject to stress. Thus, larger channels may be formed, up to 500 µm, without the risk of collapsing or breaking of the diaphragm.

The process is simple and reliable; in particular the second embodiment requires one less masking step than the first embodiment and thus is less expensive, although it involves a partial oxidation of the diaphragm surface.

Finally, it is clear that numerous variations and modifications may be made to the process and to the microreactor described and illustrated herein, all falling within the scope of the invention, as defined in the attached claims.

For example, the larger channels may be combined with other elements needed to make a completely integrated microreactor. For example, the large channels may be combined with an injection port, a micropump, lysis, reaction and detection chambers, and the like.

The invention claimed is:

1. An integrated microreactor comprising:
   a) a body of semiconductor material;
   b) a buried channel in said body and having walls and a coating layer of insulating material coating said walls;
   c) a diaphragm upwardly closing said channel, said diaphragm comprising a semiconductor layer completely encircling mask portions of insulating material, wherein said semiconductor layer is surrounded by an oxide layer;
   d) a structural layer extending on top of said body and said diaphragm;
   e) a reservoir layer extending on top of said structural layer and a first reservoir extending through said reservoir layer as far as said structural layer; and
   f) a first aperture extending through said structural layer and connecting said first reservoir with said channel.

2. The integrated microreactor of claim 1, wherein said channel has a width $\geq 200$ µm.

3. The integrated microreactor of claim 2, wherein said channel has a width between 200 µm and 500 µm.

4. The integrated microreactor of claim 2, further comprising:
   a) a second reservoir extending through said reservoir layer as far as said structural layer; and;
   b) a second aperture extending through said structural layer and connecting said second reservoir with said channel.

5. The integrated microreactor of claim 2, wherein said body is of monocrystalline silicon and said coating layer is of oxide.

6. The integrated microreactor of claim 4, wherein said body is of monocrystalline silicon and said coating layer is of oxide.

7. The integrated microreactor of claim 6, wherein said structural layer is a psuedo epitaxial layer.

* * * * *